(12) United States Patent  
Kamins (10) Patent No.: US 7,446,024 B2  
(45) Date of Patent: Nov. 4, 2008

(54) METHOD OF FORMING NANOWIRES WITH A NARROW DIAMETER DISTRIBUTION

(75) Inventor: Theodore I Kamins, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 360 days.

(21) Appl. No.: 11/158,760

(22) Filed: Jun. 21, 2005

(65) Prior Publication Data

US 2007/0178709 A1    Aug. 2, 2007

(51) Int. Cl.
*H01L 21/20* (2006.01)

(52) U.S. Cl. .................. 438/478; 438/507; 977/844; 257/E21.09; 257/E21.131; 257/E21.461

(58) Field of Classification Search .................. 428/323, 428/357, 364; 438/478, 507; 977/844, 880
See application file for complete search history.

(56) References Cited

U.S. PATENT DOCUMENTS

| 2004/0079278 A1 | 4/2004 | Kamins et al. |
| 2004/0082178 A1 | 4/2004 | Kamins |
| 2006/0057360 A1* | 3/2006 | Samuelson et al. .......... 428/323 |

* cited by examiner

*Primary Examiner*—Quoc D Hoang (57) ABSTRACT

The growth of nanowires with a narrow diameter distribution is provided. The growth comprises: providing a substrate; providing a plurality of nanoparticles having a distribution of particle sizes on the substrate; initiating growth of nanowires by a vapor-liquid-solid technique; and terminating growth of the nanowires.

38 Claims, 6 Drawing Sheets

METHOD OF FORMING NANOWIRES WITH A NARROW DIAMETER DISTRIBUTION

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. MDA972-01-3-0005 awarded by the Defense Advanced Research Projects Agency.

TECHNICAL FIELD

The present invention is directed to the growth of nanowires, and, more particularly, to the growth of nanowires having a narrow distribution in diameter.

BACKGROUND ART

Silicon and other semiconductor nanowires have potential uses in future nanoelectronic, nanophotonic, and sensing devices. One method of forming these wires is the "vapor-liquid-solid" (VLS) technique in which a liquid metal nanoparticle catalyzes the decomposition of a gas, such as silane, dichlorosilane, silicon tetrachloride, or germane, which is a source of the desired nanowire-forming material, such as silicon, germanium, indium phosphide, etc.

For many applications, the diameter of the nanowire must be controlled. The diameter of the nanowire is expected to depend on the size of the nanoparticle on which the wire is grown. Two methods of controlling the nanowire diameters are (1) controlling the nanoparticle diameters and their distribution, and (2) growing nanowires on a size-selected portion of the nanoparticle distribution. Most approaches to nanowire-diameter control focus on the former method. Size control of the nanoparticles is feasible for some materials, especially when those materials are formed ex-situ. However, it is difficult if the nanoparticles are formed in-situ to avoid air exposure between nanoparticle formation and nanowire growth.

Thus, there is a need for an improved method of growing nanowires.

DISCLOSURE OF INVENTION

In accordance with the embodiments disclosed herein, growth of nanowires is provided. In an embodiment, growth of nanowires with a narrow diameter distribution comprises: providing a substrate; providing a plurality of nanoparticles having a distribution of particle sizes on the substrate; initiating growth of nanowires by a vapor-liquid-solid technique; and terminating growth of the nanowires.

In another embodiment, a method of controlling a distribution of nanowire diameters resulting from growth of the nanowires is provided. The method comprises: providing a plurality of nanoparticles having a narrow distribution of particle sizes, initiating growth of nanowires by a vapor-liquid-solid technique; and terminating growth of the nanowires.

In yet another embodiment, a method of growing nanowires is provided. The method comprises: providing a substrate; forming nanoparticles with a distribution of sizes; heating the substrate and the nanoparticles in the presence of a gas containing a semiconductor; nucleating the nanowires on size-selected portions of the nanoparticle distribution; allowing the nanowires to continue to grow, with the length of the nanowires at any time depending on the diameter of the nanoparticles, wherein the longest nanowires have a diameter slightly below a critical diameter, with a sharp cut-off for larger diameters and a slow decrease for smaller diameters so that the distribution is skewed toward smaller diameters.

BEST MODES FOR CARRYING OUT THE INVENTION

Reference is made now in detail to specific embodiments, which illustrates the best mode presently contemplated by the inventor for practicing the invention. Alternative embodiments are also briefly described as applicable.

In accordance with the teachings herein, growth of nanowires is provided. In an embodiment, growth of nanowires with a narrow diameter distribution is provided. In another embodiment, a method of controlling a distribution of nanowire diameter resulting from growth of the nanowires is provided. In yet another embodiment, a method of growing nanowires is provided.

The present embodiments focus on the latter method disclosed above in the Background Art, namely, growing nanowires on a size-selected portion of the nanoparticle distribution. More specifically, the present teachings are directed to showing how to form nanowires with a smaller average or median diameter and narrower distribution than the average or median diameter of the nanoparticles and their distribution. It is applicable when the "vapor-liquid-solid" (VLS) process is used to grow the nanowires, and may be useful when other processes are used.

Two embodiments of the method are described below. The first is the basic method, while the second describes a process that further narrows the distribution of nanowire diameters.

Basic Method.

The VLS technique relies on choosing nanowire deposition conditions at which the catalyzing nanoparticle is liquid or forms a liquid phase eutectic with the incoming nanowire material. The melting or eutectic temperature of bulk materials is generally well known. However, as the size of the nanoparticle decreases, the melting or eutectic temperature decreases. Therefore, smaller nanoparticles can be in the liquid form while larger nanoparticles and bulk material are in the solid form. Because nanowires grow more readily on liquid nanoparticles, they will grow most easily on the smaller nanoparticles within the distribution of nanoparticles, forming nanowires with smaller average diameter than that corresponding to the average of the nanoparticle distribution. The diameter of the largest nanoparticle on which nanowires grow can be controlled by adjusting the temperature to a specific temperature below the bulk eutectic temperature.

Growth with a solid nanoparticle does not occur as easily as with liquid nanoparticles, so little, if any, growth would occur using a solid nanoparticle under the same conditions. Stated in greater detail, nanowire growth requires diffusion of the semiconductor atoms through or around the nanoparticles so that the surface does not get covered by the semiconductor atoms. This diffusion may be the limiting step in the overall nanowire growth process. If the diffusion is not rapid enough, then the surface of the catalyst gets covered by the semiconductor atoms, which then block the catalytic action and the nanowire growth. If the nanoparticles are in the liquid phase, then diffusion through the liquid phase is much easier than if the nanoparticles are in the solid phase, and nanowire growth proceeds more readily. The range of conditions for growth with the nanoparticles in the solid phase is much more limited and probably not the same as the conditions for growth with the nanoparticles in the liquid phase. When the nanoparticles are in the solid phase, one could argue that nanowire growth can only occur when the diffusion is rapid enough that the depositing semiconductor atoms move away from the surface and leave exposed catalyst sites for the reaction to occur. The diffusion takes a longer time if the diffusion path length (either through the nanoparticle or along its surface) is greater; therefore, nanowire growth might occur on smaller nanoparticles, but not on larger ones. The transition probably would not be as abrupt, however, as in the first case where the size limit is determined by the liquid or solid state of the nanoparticle. However, adjusting the arrival rate of the semiconductor-containing gas might allow control of the critical diameter below which nanowires can grow.

Narrow Distribution of Nanowire Diameters.

Under selected conditions, the nanowire growth rate is expected to depend on the nanowire diameter, with larger diameter nanowires growing faster. Therefore, within the array of growing nanowires, the ones that grow more rapidly will be near the larger end of the distribution of diameters allowed by the basic method.

Therefore, the distribution of nanowire diameters will be narrowed, with a largest diameter determined by the basic method, above. In addition, within the allowed distribution determined by the basic method, the dominant (longer) nanowires will form a narrower distribution, as determined by this preferred embodiment.

The method is applicable to the VLS process (where the state of the nanoparticle depends on its size and can be controlled by varying the temperature) and may also apply to other processes in which the probability of forming a nanowire depends on the state of the nanoparticle and the state can be controlled by an accessible variable (such as temperature).

Figure 1:
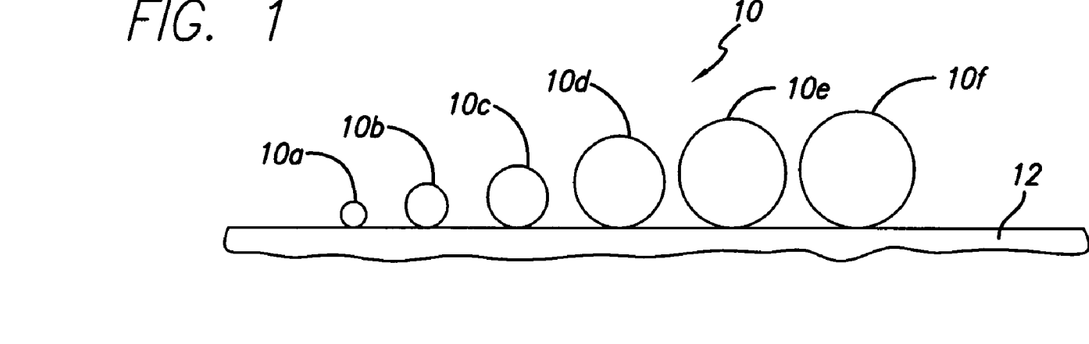
FIG. 1 is a schematic view of a variety of nanoparticles with random size distribution on a substrate.

FIG. 1 illustrates a plurality of nanoparticles 10a-10f arrayed on a substrate 12. The particle size ranges from comparatively small 10a to comparatively large 10f. In one embodiment, the nanoparticles 10 are metallic. In a more specific embodiment, the nanoparticles 10 are gold. While the nanoparticles 10 are shown as circular (in cross-section, spherical in 3-dimensions), it will be appreciated that the nanoparticles do not necessarily need to be spherical.

In one embodiment, the substrate 12 is a semiconductor. In a more specific embodiment, the substrate 12 is silicon or germanium.

Figure 2:
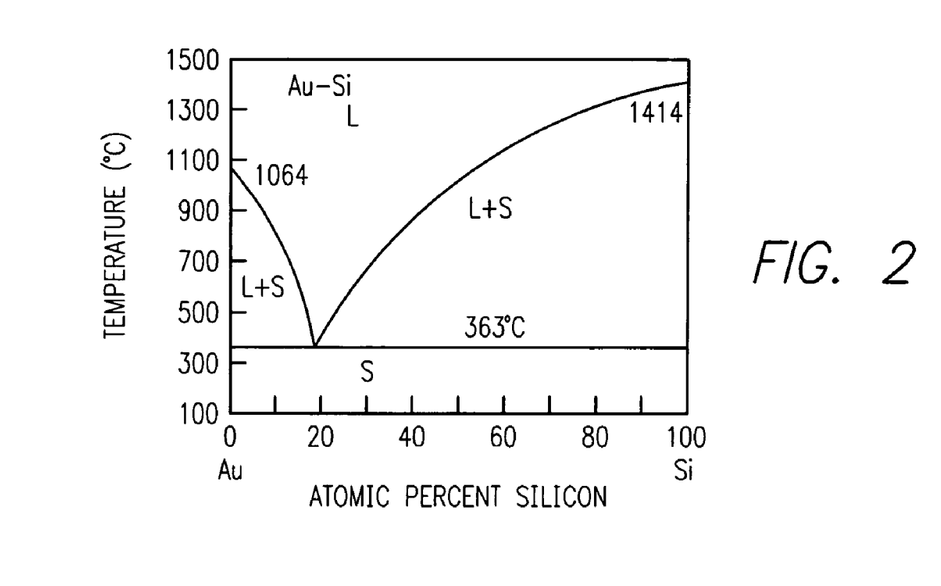
FIG. 2, on coordinates of temperature (° C.) and atomic percent, is a plot of the binary phase diagram for the system Au—Si.

The binary phase diagram of the gold-silicon (Au—Si) system is shown in FIG. 2, wherein L is liquid and S is solid. It will be seen that the bulk eutectic temperature is 363° C., at about 18 atomic percent (at %) silicon. The gold-germanium (Au—Ge) binary system is similar, with a bulk eutectic temperature of 361° C., at about 28 atomic percent germanium.

The growth of silicon or germanium nanowires using a nanoparticle as a catalyst for growth is well known; see, e.g., (1) application Ser. No. 10/281,678, filed Oct. 28, 2002 [PD-100111715-1], published as Publication No. 2004-0082178 on Apr. 29, 2004, for methods directed to forming the nanoparticles on a substrate, and (2) application Ser. No. 10/690,688, filed Oct. 21, 2003 [PD-200209306-1], published as Publication No. 2004-0079278 on Apr. 29, 2004, for methods directed to growing the nanowires in the presence of the nanoparticle catalyst. The contents of both references are incorporated herein by reference.

The growth of the nanoparticles is shown in FIGS. 3a-3d. Essentially, metal nanoparticles 10 are formed on the substrate 12 and are exposed to a gas containing the desired nanowire constituent. In the case of forming germanium nanowires, germane ($GeH_4$) may be used as the gas, while in the case of forming silicon nanowires, silane ($SiH_4$) or dichlorosilane ($SiCl_2H_2$) may be used as the gas.

In general, the metallic nanoparticles 10 comprise a catalytic material capable of catalyzing the growth of nanowires 14. Accordingly, the nanoparticles 12 can include metals used to generate silicon nanowires, such as, but not limited to, titanium, gold, platinum, palladium, nickel, and manganese. In an embodiment for generating germanium or silicon nanowires, the catalytic material 10 is gold. Nanowires of other semiconductor materials can also be grown by catalyzed growth. The catalyst for the growth of such semiconductor materials is, in many cases, known in the art.

The nanowires 14 grow at an angle to the substrate plane, with nearly vertical growth being common and most conceptually easiest to visualize, but non-vertical orientation of the nanowires may alternatively be used.

The metal nanoparticles 10 are formed on the substrate 12. These nanoparticles 10 can be formed by evaporating a very thin layer (approximately atomic layer thickness) on the substrate 12 and annealing to condense the metal into individual particles 10, preferably with no metal on the substrate 12 between the particles. Alternatively, the nanoparticles 10 can be deposited from a commercially available colloidal suspension of appropriately-sized nanoparticles.

After the nanoparticles 10 are formed, they are exposed to a gas or gases (not shown) as described above. Deposition variables are adjusted so that the reaction rate of the gas on the substrate 12 is small, while that on the metal particle 10 is much greater; the metal nanoparticle accelerates or catalyzes the decomposition of the gas. Atoms of the semiconductor material deposited on the nanoparticle 10 diffuse through or around the nanoparticle, which may be either in the liquid or solid state during wire formation, and precipitate on the underlying substrate 12, pushing the metal nanoparticle up and leaving a columnar semiconductor deposit 14 (i.e., a nanowire) behind. The diameter of the nanowire 14 is similar to that of the nanoparticle 10.

In an embodiment, the substrate 12 comprises silicon and the metal nanoparticles 10 comprise gold. In this example, it is desired to grow germanium (Ge) nanowires 14. This is done by introducing a gaseous source containing Ge, such as germane ($GeH_4$). The germane molecules react with the gold nanoparticles 10, forming Ge atoms by catalyzed surface reaction and releasing $H_2$; the Ge atoms diffuse through or around the gold nanoparticles 10 to the substrate 12 where they precipitate, thereby forming the nanowires 14. Alternatively, the Ge atoms can be provided by physical deposition techniques, such as laser ablation, followed by adsorption and surface diffusion.

In another embodiment, the substrate 12 comprises silicon and the metal nanoparticles 10 comprise any of the metals previously listed above, such as gold. In this case, the gaseous source contains Si, such as silane ($SiH_4$) or dichlorosilane (SiCl$_2$H$_2$), and silicon nanowires 14 are formed, using a process essentially similar to that outlined in the previous paragraph.

The foregoing technique is often termed "vapor-liquid-solid" (VLS) growth. It has been discovered that nanoparticles larger than a certain diameter, called herein the "critical diameter", remain in the solid phase, and nanowires do not readily grow from such larger nanoparticles.

Figure 3A:
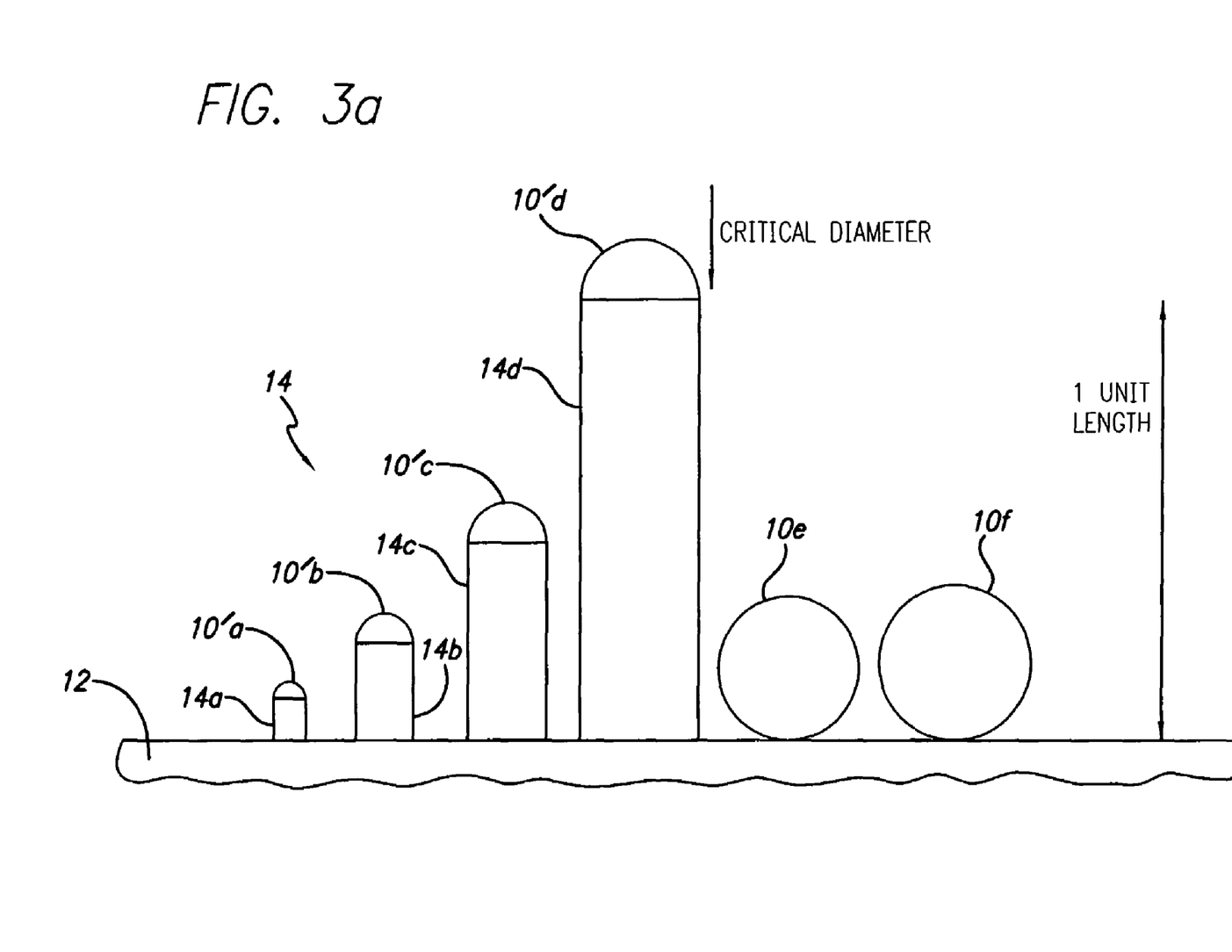
FIGS. 3a-3d are schematic views, similar to FIG. 1, illustrating the sequence of events in the growth of various size nanowires as a function of time, illustrating an embodiment of the invention.

However, for nanoparticles having a diameter smaller than the critical diameter, nanowires will grow, as illustrated in FIG. 3a. The critical diameter for the case where nanowires grow on liquid nanoparticles is determined by the reduction of the eutectic temperature below its bulk value because of the small nanoparticle size. The magnitude of the reduction can be calculated if enough physical constants for the catalyst material are known. In the case where nanowires grow on solid nanoparticles, the critical diameter would depend on the diffusion time (surface or bulk) to remove the semiconductor atoms from the surface of the catalyst compared to a time related to the reciprocal of the arrival and reaction rates. This time should depend on both the nanowire material and the catalyst material.

Below the critical diameter, the growth rate of the nanowires depends on the diameter D of the nanoparticles according to the formula:

growth rate $\propto [A-(B/D)]^2$, where the coefficients A and B are functions of the material parameters and the growth conditions (mainly temperature and equivalent partial pressure of the semiconductor-containing gas).

As seen in FIG. 3a, only nanoparticles 10 having a diameter less than the critical diameter result in the growth of the nanowires 14. Specifically, nanoparticles 10e and 10f are too large to result in growth of nanowires, while nanoparticles 10a-10d result in growth of nanowires 14a-14d, respectively. Although this is a schematic figure, it will be seen that the larger-diameter (but less than the critical diameter) nanowires grow faster than the smaller diameter nanowires. In FIG. 3a, the nanowires 14 have been grown to a length of 1 unit. The nanowires 14a-14d are capped with nanoparticle caps 10'a-10'd, respectively, which continue to catalyze growth of the nanowires in the presence of the semiconductor-containing gas.

Figure 3B:
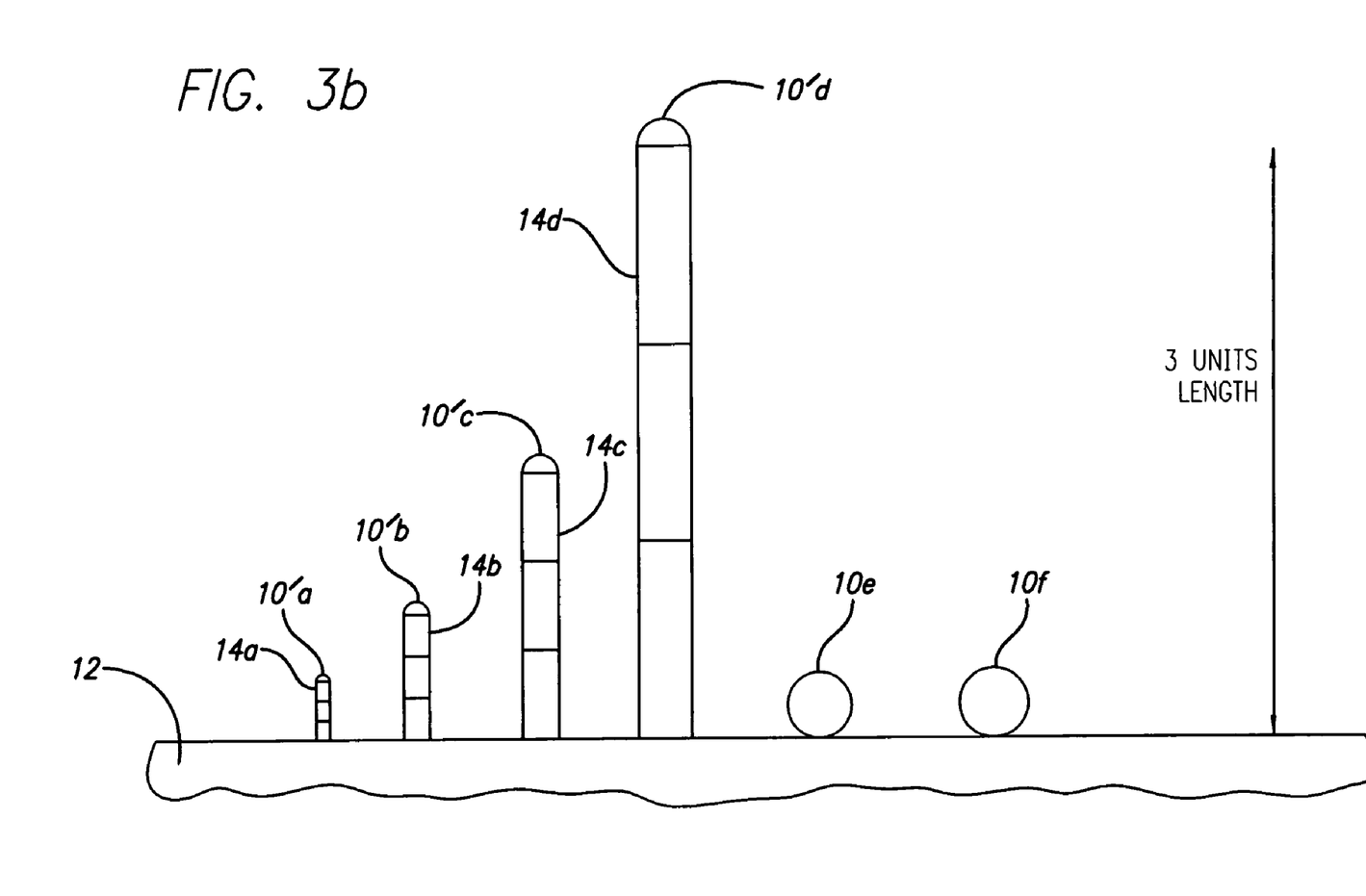
Figure 3C:
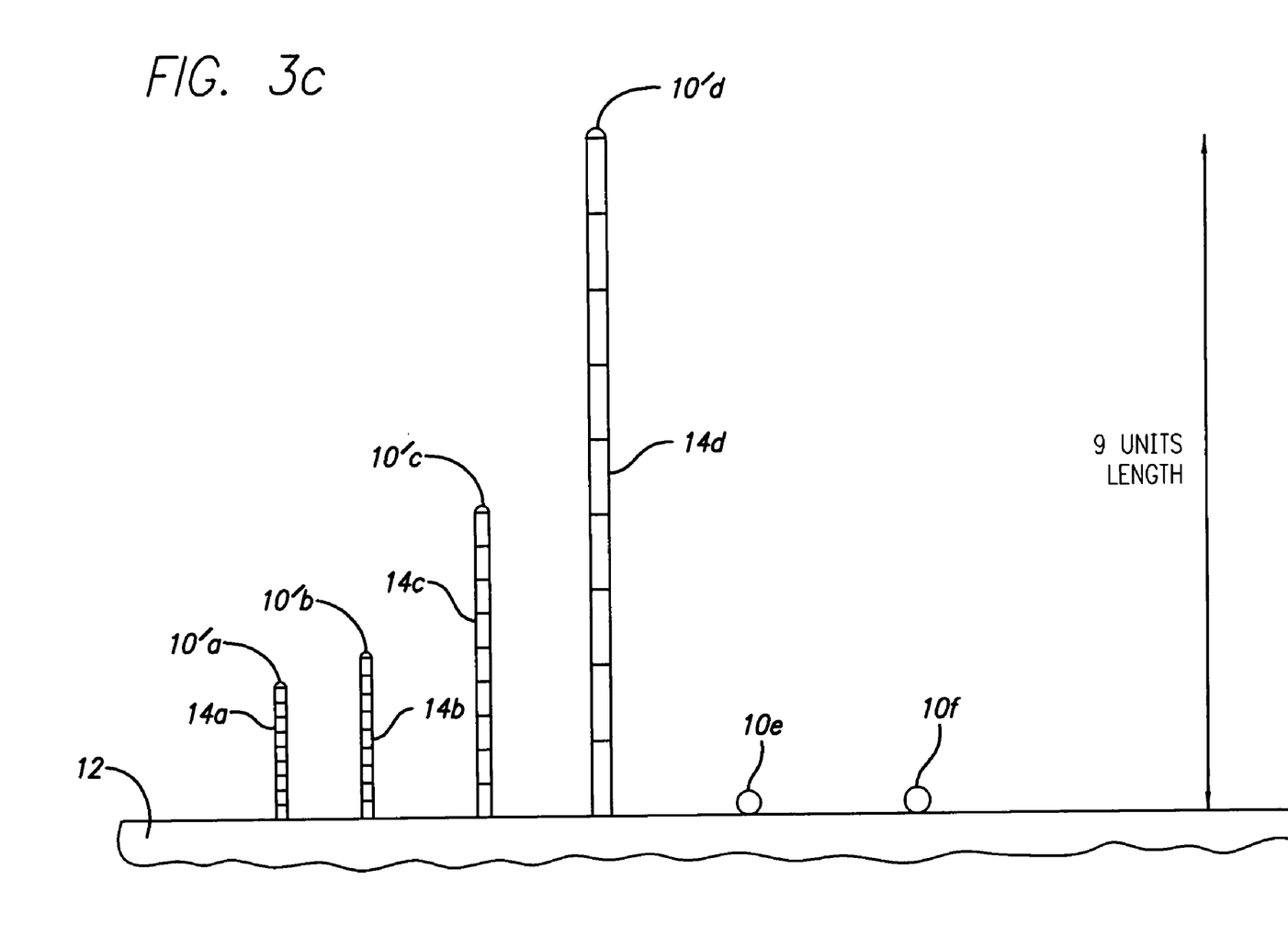

FIG. 3b depicts the situation after growth to a length of 3 units, while FIG. 3c depicts the situation after growth to a length of 9 units. In each case, the nanowires 14a-14d continue to grow, with nanowire 14d growing to the longest length.

Figure 3D:
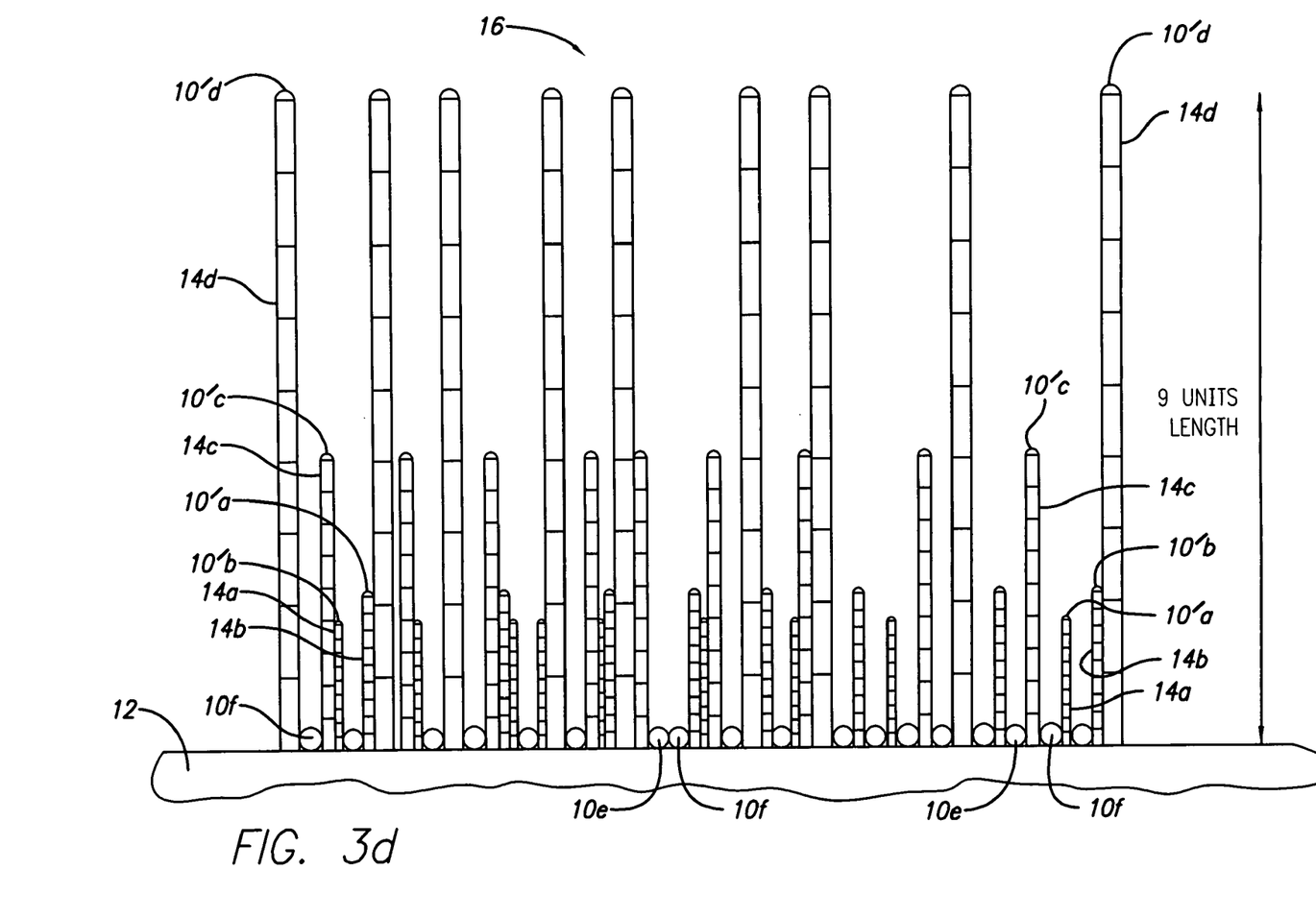

FIG. 3d depicts an array 16 of nanowires 14a-14d having been grown from nanoparticles 10a-10d, respectively, of different diameters. In the array 16, the nanowires 14d with a diameter slightly below the critical diameter are seen to dominate. In this manner, nanowires 14 having a narrow diameter distribution are grown.

Figure 4:
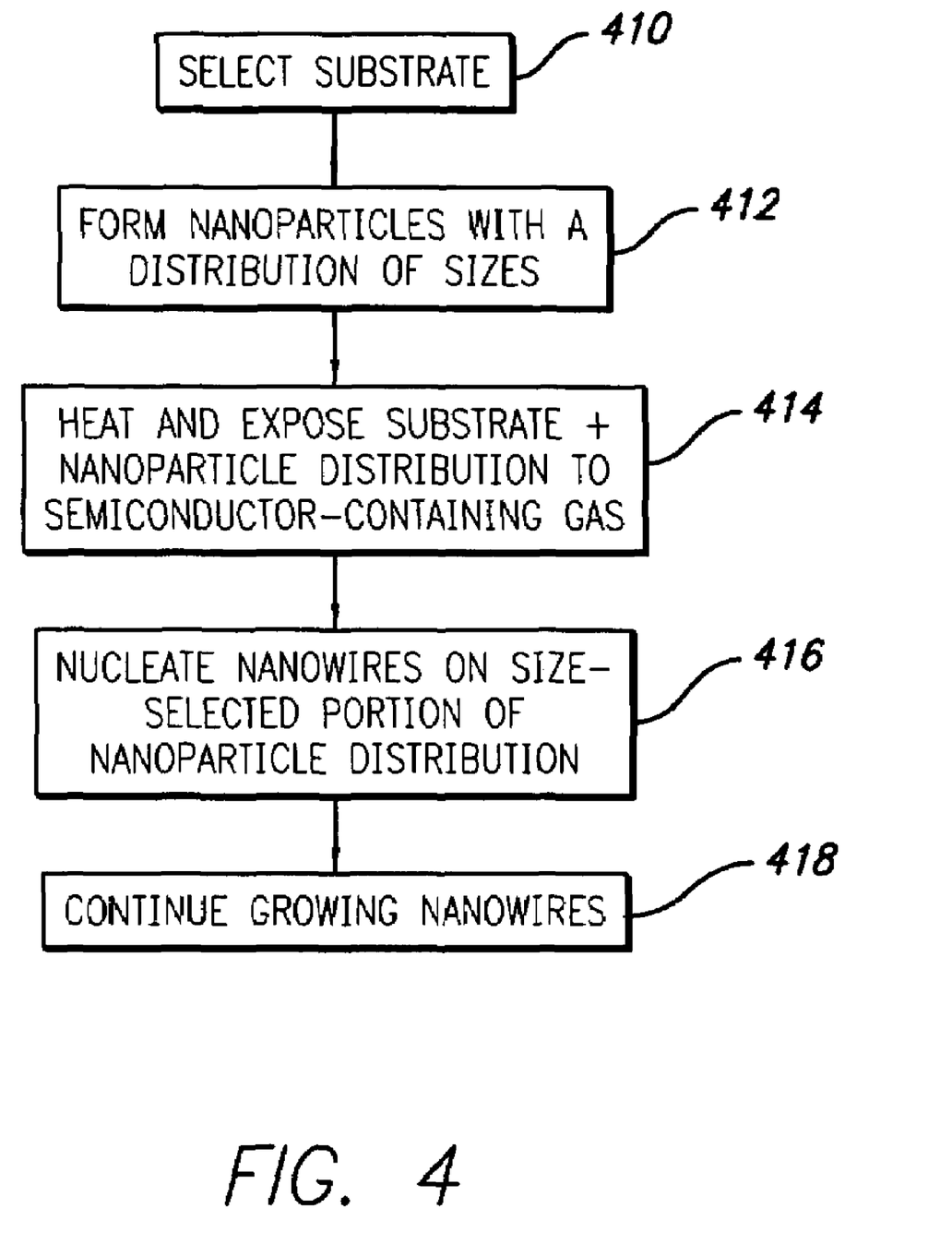
FIG. 4 illustrates the steps employed in an embodiment of the growth of nanowires.

FIG. 4 depicts an embodiment for practicing the present teachings. In step 410, a substrate is selected. In step 412, nanoparticles are formed with a distribution of sizes. In step 414, the substrate and the nanoparticles are heated in the presence of a gas containing a semiconductor. In step 416, nanowires are nucleated on size-selected portions of the nanoparticle distribution. In step 418, the nanowires continue to grow, with the length of the nanowires at any time depending on the diameter (the longest nanowires are slightly below the critical diameter), with a sharp cut-off for larger diameters and a slow decrease for smaller diameters so that the distribution is skewed toward smaller diameters.

Growth of the nanowires may be terminated in a number of ways. For example, it may be desired to grow nanowires from a first electrode to a second electrode. In this case, growth is initiated on a surface of the first electrode and is terminated when the nanowire reaches an opposing surface of the second electrode. Alternatively, it may be desired to grow nanowires on a substrate and form devices in situ. In this case, growth is initiated on the substrate and is terminated when the nanowires reach a desired length, as determined, for example, by reference to a predetermined table relating growth rate to the various growth parameters. In either case, termination is achieved by simply turning off the nanowire precursor gas source.

The embodiments disclosed herein are directed to relaxing the requirements on controlling the nanoparticle size. In this connection, it may be desirable to start with a distribution of nanoparticle sizes as narrow as is easy to prepare and then use the methods disclosed herein to further narrow the diameter distribution of the grown nanowires. If starting with a narrower nanoparticle size distribution is expensive or difficult, it is not necessary to do this, because the method described here will prevent growth on larger nanoparticles and will decrease the growth rate on smaller nanoparticles.

As used herein, the term "narrow" with respect to nanoparticle size means a diameter distribution with a half width of approximately 20% of the diameter at the peak of the distribution, where the limits of the distribution are defined by a length $1/\sqrt{2}$ times the length of the longest nanowires in the distribution. As discussed above, the diameter distribution decreases rapidly for diameters greater than the diameter corresponding to the peak of the distribution—ie, just below the critical diameter—and less rapidly for diameters smaller than the diameter corresponding to the peak of the distribution.

As an example of the decrease of the diameter distribution for diameters greater than the peak of the distribution, we use the parameters for Pb nanoparticles because those are well known; the parameters for other nanoparticles are analogous. The critical diameter depends strongly on temperature; therefore, the variability of the critical diameter depends primarily on the ability to control the temperature. For a technologically reasonable 1° C. temperature control, 20 nm nominal diameter nanowires, and 360° C. bulk eutectic temperature, the uncertainty in the critical diameter is approximately 6% (ie, the largest diameter can be about 21 nm), indicating the degree of control possible for the largest nanowire diameter. Thus, the peak of the distribution should be only slightly below the critical diameter; in this example, within about 6% of the critical diameter.

In the growth of germanium nanowires using gold nanoparticles having a particle size of 20 nm to catalyze growth, the following growth conditions were observed (keeping in mind that the bulk eutectic temperature for the Au—Ge binary system 361° C. (at 28 at % Ge):

| Temperature, ° C. | Observed Growth |
|---|---|
| 310 | none |
| 320 | none |
| 330 | good |
| 355 | marginal |
| 380 | poor |

Although the bulk eutectic temperature is approximately 360° C., the small size of the nanoparticle reduces the eutectic temperature. For the example of 20 nm nanoparticles, the nanoparticles are in the liquid phase at 330° C., and nanowires grow. At 320° C. and below, the nanoparticles are in the solid phase, and nanowires do not grow. At the fixed temperature of 330° C., nanoparticles slightly larger than the 20 nm used in this example will be in the solid phase, and nanowires will not grow. Thus, the upper bound of the nanowire diameter will be approximately 20 nm.

It will be appreciated by those skilled in this art that the growth temperature also affects the diameter of the nanowire by determining the largest diameter nanoparticles on which nanowires grow. It should also be noted, that the relevant nanoparticle size is that at the start of the nanowire growth; agglomeration of nanoparticles during heat treatment before nanowire growth can change the diameter of the nanoparticles.

What is claimed is:

1. A method of growing nanowires with a narrow diameter distribution, said method comprising:
    providing a substrate having a first surface;
    providing a plurality of nanoparticles having a distribution of particle sizes on said first surface;
    initiating growth of nanowires by a vapor-liquid-solid technique; and
    terminating growth of said nanowires, wherein said nanowires grow at a rate that depends on the diameter of said nanowire, with larger diameter nanowires growing faster.

2. The method of claim 1 wherein the diameter of the largest nanoparticle on which nanowires grow is controlled by adjusting the temperature of the vapor-liquid-solid growth to a pre-selected temperature below the bulk eutectic temperature defined by material comprising said nanowire and said nanoparticle.

3. The method of claim 1 wherein said nanowires comprise a semiconductor material.

4. The method of claim 3 wherein said semiconductor material is selected from the group consisting of silicon and germanium.

5. The method of claim 4 wherein said semiconductor material is silicon and said vapor employed in said vapor-liquid-solid technique comprises a gas selected from the group consisting of silane, dichlorosilane, and silicon tetrachloride.

6. The method of claim 4 wherein said semiconductor material is germanium and said vapor employed in said vapor-liquid-solid technique comprises germane.

7. The method of claim 1 wherein said nanoparticles comprise a metal.

8. The method of claim 7 wherein said metal is selected from the group consisting of titanium, gold, platinum, palladium, nickel, and manganese.

9. The method of claim 1 wherein the length of said nanowires is terminated by impinging on a second surface, opposed to and spaced from said first surface.

10. The method of claim 1 wherein growth of said nanowires is terminated when larger nanowires reach a pre-determined length.

11. The method of claim 1 wherein nanoparticles less than a critical diameter result in growth of nanowires.

12. The method of claim 11 wherein said critical diameter D is given by growth rate $\alpha [A-(B/D)]^2$, where A and B depend on temperature and material properties and B also depends on the equivalent partial pressure of said vapor.

13. The method of claim 11 wherein nanowires having a diameter slightly below said critical diameter are longer than nanowires of smaller diameter.

14. A method of controlling a distribution of nanowire diameters resulting from growth of said nanowires, said method comprising:
    providing a substrate having a first surface;
    providing a plurality of nanoparticles having a narrow distribution of particle sizes below a critical diameter on said first surface;
    initiating growth of nanowires by a vapor-liquid-solid technique; and
    terminating growth of said nanowires, wherein said nanowires grow at a rate that depends on the diameter of said nanowire, with larger diameter nanowires growing faster.

15. The method of claim 14 wherein the diameter of the largest nanoparticle on which nanowires grow is controlled by adjusting the temperature of the vapor-liquid-solid growth to a pre-selected temperature below the bulk eutectic temperature defined by material comprising said nanowire and said nanoparticle.

16. The method of claim 14 wherein said nanowires comprise a semiconductor material.

17. The method of claim 16 wherein said semiconductor material is selected from the group consisting of silicon and germanium.

18. The method of claim 17 wherein said semiconductor material is silicon and said vapor employed in said vapor-liquid-solid technique comprises silane or dichlorosilane.

19. The method of claim 17 wherein said semiconductor material is germanium and said vapor employed in said vapor-liquid-solid technique comprises germane.

20. The method of claim 14 wherein said nanoparticles comprise a metal.

21. The method of claim 20 wherein said metal is selected from the group consisting of titanium, gold, platinum, palladium, nickel, and manganese.

22. The method of claim 14 wherein the length of said nanowires is terminated by a second surface, opposed to and spaced from said first surface.

23. The method of claim 14 wherein growth of said nanowires is terminated when larger nanowires reach a pre-determined length.

24. The method of claim 14 wherein said critical diameter D is given by growth rate $\alpha [A-(B/D)]^2$, where A and B depend on temperature and material properties and B also depends on the equivalent partial pressure of said vapor.

25. The method of claim 14 wherein nanowires having a diameter slightly below said critical diameter are longer than nanowires of smaller diameter.

26. A method of growing nanowires, comprising:
    providing a substrate;
    forming nanoparticles with a distribution of sizes;
    heating said substrate and said nanoparticles in the presence of a gas containing a semiconductor;
    nucleating said nanowires on size-selected portions of the nanoparticle distribution; and
    allowing said nanowires to continue to grow, with the length of said nanowires at any time depending on the diameter of said nanoparticles, wherein the longest nanowires have a diameter slightly below a critical diameter, with a sharp cut-off for larger diameters and a slow decrease for smaller diameters so that the distribution is skewed toward smaller diameters.

27. The method of claim 26 wherein the diameter of the largest nanoparticle on which nanowires grow is controlled by adjusting the temperature of the vapor-liquid-solid growth to a pre-selected temperature below the bulk eutectic temperature defined by material comprising said nanowire and said nanoparticle.

28. The method of claim 27 wherein said nanowires grow at a rate that depends on the diameter of said nanowire, with larger diameter nanowires growing faster.

29. The method of claim 27 wherein said nanowires comprise a semiconductor material.

30. The method of claim 29 wherein said semiconductor material is selected from the group consisting of silicon and germanium.

31. The method of claim 30 wherein said semiconductor material is silicon and said vapor employed in said vapor-liquid-solid technique comprises silane or dichlorosilane.

32. The method of claim 30 wherein said semiconductor material is germanium and said vapor employed in said vapor-liquid-solid technique comprises germane.

33. The method of claim 26 wherein said nanoparticles comprise a metal.

34. The method of claim 33 wherein said metal is selected from the group consisting of titanium, gold, platinum palladium, nickel, and manganese.

35. The method of claim 26 wherein the length of said nanowires is terminated by a second surface, opposed to and spaced from said first surface.

36. The method of claim 26 wherein growth of said nanowires is terminated when larger nanowires reach a pre-determined length.

37. The method of claim 26 wherein said critical diameter D is given by $$\text{growth rate } \alpha[A-(B/D)]^2,$$

where A and B depend on temperature and material properties and B also depends on the equivalent partial pressure of said vapor.

38. The method of claim 26 wherein nanowires having a diameter slightly below said critical diameter predominate in length over nanowires of smaller diameter.

* * * * *

UNITED STATES PATENT AND TRADEMARK OFFICE
CERTIFICATE OF CORRECTION

PATENT NO.         : 7,446,024 B2
APPLICATION NO.    : 11/158760
DATED              : November 4, 2008
INVENTOR(S)        : Theodore I Kamins Page 1 of 1

It is certified that error appears in the above-identified patent and that said Letters Patent is hereby corrected as shown below:

In column 7, line 67, in Claim 12, delete "growth rate $\alpha[A-(B/D)]^2$," and insert -- growth rate $\propto [A-(B/D)]^2$, --, therefor.

In column 8, line 50, in Claim 24, delete "growth rate $\alpha[A-(B/D)]^2$," and insert -- growth rate $\propto [A-(B/D)]^2$, --, therefor.

In column 10, line 15, in Claim 37, delete "growth rate $\alpha[A-(B/D)]^2$," and insert -- growth rate $\propto [A-(B/D)]^2$, --, therefor.

Signed and Sealed this

Eighth Day of December, 2009

David J. Kappos
*Director of the United States Patent and Trademark Office*